US012622302B2

(12) United States Patent
Yim et al.

(10) Patent No.: US 12,622,302 B2
(45) Date of Patent: May 5, 2026

(54) SEMICONDUCTOR PACKAGE INCLUDING A LOWER SUBSTRATE AND AN UPPER SUBSTRATE

(71) Applicant: SAMSUNG ELECTRONICS CO., LTD., Suwon-si (KR)

(72) Inventors: Choongbin Yim, Seoul (KR); Jongbo Shim, Asan-si (KR); Jihwang Kim, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 970 days.

(21) Appl. No.: 17/715,417

(22) Filed: Apr. 7, 2022

(65) Prior Publication Data

US 2023/0021867 A1    Jan. 26, 2023

(30) Foreign Application Priority Data

Jul. 19, 2021    (KR) ......................... 10-2021-0094046

(51) Int. Cl.
*H01L 23/498* (2006.01)
*H01L 23/00* (2006.01)
(Continued)

(52) U.S. Cl.
CPC .... *H01L 23/49822* (2013.01); *H01L 23/3107* (2013.01); *H01L 23/49816* (2013.01);
(Continued)

(58) Field of Classification Search
CPC ............. H01L 23/562; H01L 23/49822; H01L 23/5389; H01L 23/49833
See application file for complete search history.

(56) References Cited

U.S. PATENT DOCUMENTS 8,710,634 B2    4/2014  Chi et al.
9,406,636 B2    8/2016  Zhao et al.
(Continued)

FOREIGN PATENT DOCUMENTS

KR            10-1901711 B1    9/2018
KR    10-2019-0005728 A    1/2019
KR    10-2019-0079065 A    7/2019

*Primary Examiner* — Amar Movva
(74) *Attorney, Agent, or Firm* — Wolf, Greenfield & Sacks, P.C.

(57) ABSTRACT

A semiconductor package includes: a lower substrate including a lower wiring layer; a semiconductor chip disposed on the lower substrate and electrically connected to the lower wiring layer; an upper substrate disposed on the semiconductor chip and including a core layer, an upper wiring layer, a plurality of dummy structures, and a solder resist layer, wherein the core layer has through-holes, wherein the plurality of dummy structures are disposed in the through-holes and are electrically insulated from the upper wiring layer, and wherein the solder resist layer covers the upper wiring layer and extends in the through-holes; a connection structure disposed between the lower substrate and the upper substrate; an encapsulant disposed between the lower substrate and the upper substrate and encapsulating at least a portion of each of the semiconductor chip and the connection structure; and a connection bump disposed on the lower substrate.

19 Claims, 13 Drawing Sheets

100A

(51) Int. Cl.
    *H01L 23/31*           (2006.01)
    *H01L 23/538*        (2006.01)

(52) U.S. Cl.
    CPC .. *H01L 23/49827* (2013.01); *H01L 23/49833*
          (2013.01); *H01L 23/5389* (2013.01); *H01L*
                      *23/562* (2013.01)

(56)            References Cited

U.S. PATENT DOCUMENTS

| | | |
|---|---|---|
| 9,972,581 B1 | 5/2018 | Yu et al. |
| 10,431,536 B2 | 10/2019 | Kim et al. |
| 10,937,749 B2 | 3/2021 | Shih et al. |
| 10,978,370 B2 | 4/2021 | Pel et al. |
| 2015/0144999 A1 | 5/2015 | Ching et al. |
| 2015/0221573 A1 | 8/2015 | Paek et al. |
| 2015/0318267 A1 | 11/2015 | Yu et al. |
| 2019/0198437 A1* | 6/2019 | Kim .................. H01L 23/49833 |
| 2021/0043612 A1 | 2/2021 | Lee et al. |

* cited by examiner

100A

SEMICONDUCTOR PACKAGE INCLUDING A LOWER SUBSTRATE AND AN UPPER SUBSTRATE

CROSS-REFERENCE TO RELATED APPLICATION

This application claims priority under 35 USC 119(a) to Korean Patent Application No. 10-2021-0094046 filed on Jul. 19, 2021 in the Korean Intellectual Property Office, the disclosure of Which is incorporated by reference herein in its entirety.

TECHNICAL FIELD

The present inventive concept relates to a semiconductor package, and more particularly, to a semiconductor package including a lower substrate and an upper substrate.

DISCUSSION OF THE RELATED ART

Package-on-package (POP) technology of vertically stacking two or more semiconductor packages has been under development in accordance with trends in performance and miniaturization of electronic devices. In the case of a POP structure using an interposer substrate, technological developments for controlling warpage of a lower package are currently under development.

SUMMARY

According to an exemplary embodiment of the present inventive concept, a semiconductor package includes: a lower substrate including a lower wiring layer; a semiconductor chip disposed on the lower substrate and electrically connected to the lower wiring layer; an upper substrate disposed on the semiconductor chip and including a core layer, an upper wiring layer, a plurality of dummy structures, and a solder resist layer, Wherein the core layer has through-holes, wherein the upper wiring layer is disposed on the core layer, wherein the plurality of dummy structures are respectively disposed in the through-holes and are electrically insulated from the upper wiring layer, and wherein the solder resist layer covers at least a portion of the upper wiring layer and extends in the through-holes and on the plurality of dummy structures; a connection structure disposed between the lower substrate and the upper substrate and electrically connecting the lower wiring layer and the upper wiring layer to each other; an encapsulant disposed between the lower substrate and the upper substrate and encapsulating at least a portion of each of the semiconductor chip and the connection structure; and a connection bump disposed on the lower substrate and electrically connected to the lower wiring layer.

According to an exemplary embodiment of the present inventive concept, a semiconductor package includes: a lower substrate including a lower wiring layer; a semiconductor chip disposed on the lower substrate and electrically connected to the lower wiring layer; an upper substrate disposed on the semiconductor chip and including an insulating layer, an upper wiring layer, and a plurality of dummy structures, herein the upper wiring layer is disposed on the insulating layer, and the plurality of dummy structures is electrically insulated from the upper wiring layer; and connection structures disposed to be adjacent to the semiconductor chip disposed between the lower substrate and the upper substrate and electrically connecting the lower wiring layer and the upper wiring layer to each other, wherein a first plurality of dummy structures of the plurality of dummy structures are disposed in a position overlapping the semiconductor chip and a second plurality of dummy structures of the plurality of dummy structures are disposed to not overlap the semiconductor chip.

According to an exemplary embodiment of the present inventive concept, a semiconductor package includes: a lower substrate including a lower wiring layer; a semiconductor chip disposed on the lower substrate and electrically connected to the lower wiring layer; an upper substrate disposed on the semiconductor chip and including an insulating layer and an upper wiring layer disposed on the insulating layer; a connection structure disposed between the lower substrate and the upper substrate and electrically connecting the lower wiring layer to the upper wiring layer; and a dummy structure embedded in the insulatinglayer of the upper substrate.

BRIEF DESCRIPTION OF DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described with reference to the accompanying drawings.

Figure 1A:
FIG. 1A is a cross-sectional view illustrating a semiconductor package according to an exemplary embodiment of the present inventive concept.
Figure 1A:
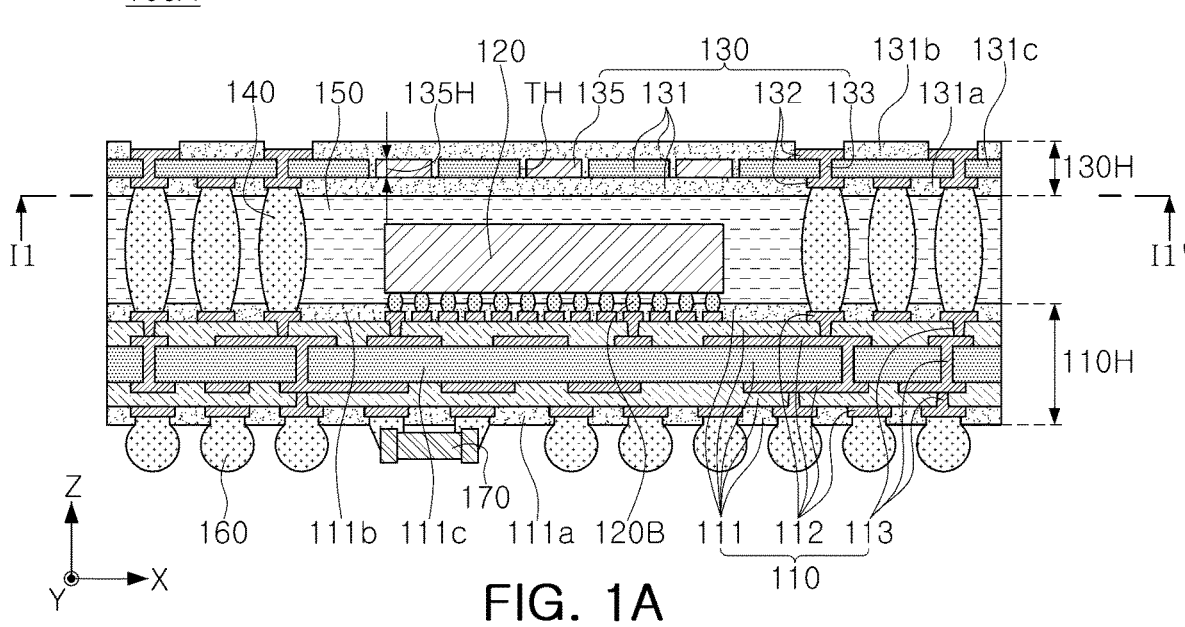
Figure 1B:
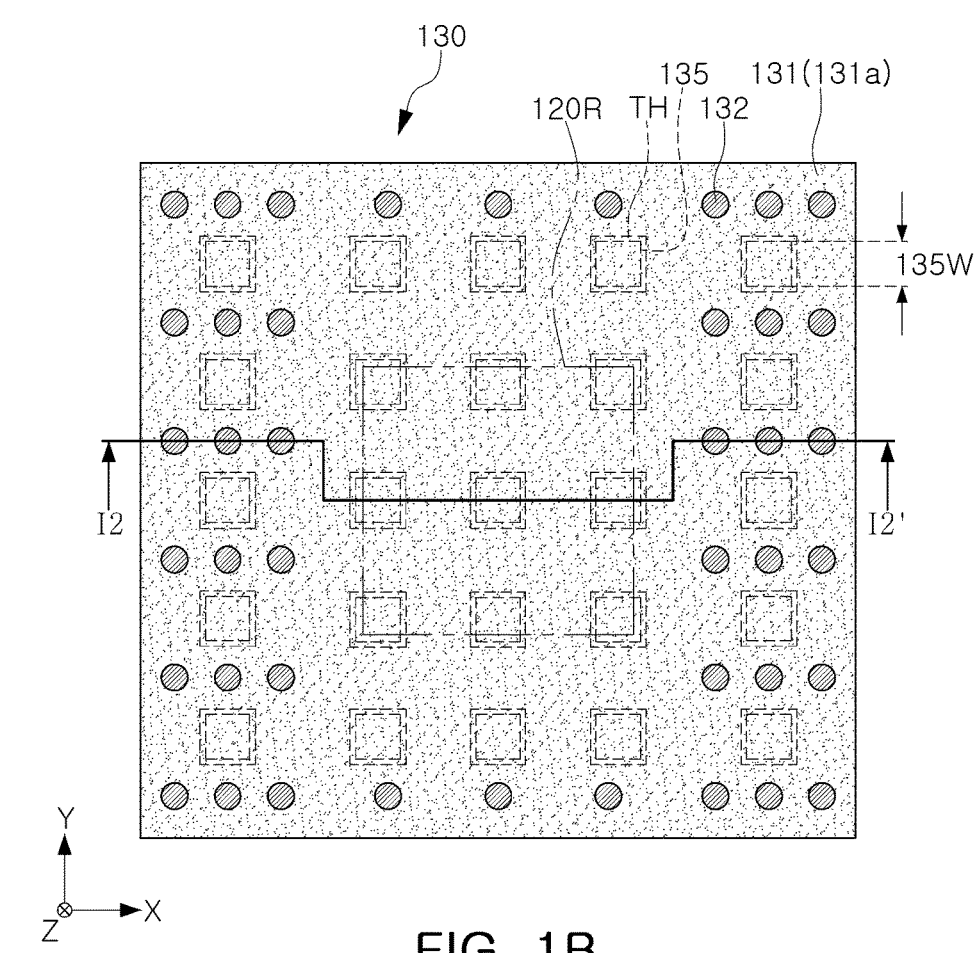
FIG. 1B is a plan view illustrating a lower surface of an upper substrate taken along line I1-I1' of FIG. 1A.

FIG. 1A is a cross-sectional view illustrating a semiconductor package 100A according to an exemplary embodiment of the present inventive concept, and FIG. 1B is a plan view illustrating a lower surface of an upper substrate 130 taken along line I1-I1' of FIG. 1A. FIG. 1A illustrates a cross-section of the upper substrate 130 taken along line I2-I2' of FIG. 1B.

Referring to FIGS. 1A and 1B, the semiconductor package 100A according to an exemplary embodiment of the present inventive concept may include a lower substrate 110, a semiconductor chip 120, an upper substrate 130, and a connection structure 140. In addition, the semiconductor package 100A may further include an encapsulant 150, a connection bump 160, and/or a passive element 170.

In the present inventive concept, warpage of a package-on-package (POP) structure including an interposer substrate (e.g., the upper substrate 130 of FIG. 1A) may be effectively improved by adjusting a coefficient of thermal expansion (CTE) of the upper substrate 130 of the semiconductor package 100A to a level similar to that of the CTE of the lower substrate 110. The upper substrate 130 may include a smaller number of wiring layers and insulating layers than that of the lower substrate 110, so that there may be a significant difference between the CTE of the upper substrate 130 and the CTE of the lower substrate 110. In this case, warpage characteristics of the semiconductor package may be deteriorated, and as a result, reliability of the semiconductor package may be deteriorated. In addition, according to the present inventive concept, the CTE of the upper substrate 130 may be adjusted using a dummy structure 135 having a smaller CTE compared to that of the upper substrate 130 and the lower substrate 110, and warpage characteristics of the semiconductor package 100A may be improved.

For example, in an exemplary embodiment of the present inventive concept, the lower substrate 110, the semiconductor chip 120, and the upper substrate 130 may be stacked in a first direction e.g., a Z-axis direction). The lower substrate 110 may have a first thickness 110H in the first direction (e.g., the Z-axis direction), and the upper substrate 130 may have a second thickness 130H smaller than the first thickness 110H in the first direction (e.g., the Z-axis direction). Numerical ranges of the first and second thicknesses 110H and 130H are not particularly limited. In this case, the upper substrate 130 may have a CTE similar to that of the lower substrate 110 by including the dummy structure 135 in the upper substrate 130. For example, by including the dummy structure 135, a difference between a first CTE of the lower substrate 110 and a second CTE of the upper substrate 130 may be about 10 ppm/° C. or less or about 5 ppm/° C. or less. For example, the difference between the first CTE of the lower substrate 110 and the second CTE of the upper substrate 130 may range from about 0.001 ppm/° C. to about 10 ppm/° C., from about 0.001 ppm/° C. to about 8 ppm/° C., from about 0.001 ppm/° C. to about 5 ppm/° C., from about 0.001 ppm/° C. to about 3 ppm/° C., and the like. When the difference between the first CTE of the lower substrate 110 and the second CTE of the upper substrate 130 exceeds about 10 ppm/° C., the warpage improvement effect obtained by introducing the dummy structure 135 may be insignificant. Hereinafter, each component will be described in detail with reference to the drawings.

The lower substrate 110 may be, for example, a support substrate on which the semiconductor chip 120 is mounted, and may be a package substrate including a lower wiring layer 112 for redistributing the semiconductor chip 120. The package substrate may include, for example, a printed circuit board (PCB), a ceramic substrate, a glass substrate, a tape interconnection board, and the like. For example, the lower substrate 110 may include an insulating layer (also referred to as a lower insulating layer) 111, a lower wiring layer 112, and a lower interconnection via 113.

The insulating layer 111 may include, for example, an insulating resin. The insulating resin may include a thermosetting resin such as an epoxy resin, a thermoplastic resin such as polyimide, a resin impregnated with an inorganic filler and/or glass fiber (or glass cloth or glass fabric), for example, a prepreg, ABF, FR-4, BT, or a photosensitive resin such as photoimageable dielectric (HD). The insulating layer 111 may include a plurality of insulating layers 111 stacked in a vertical direction (e.g., the Z-axis direction). Depending on the process, a boundary between the plurality of insulating layers 111 may not be apparent. The lowermost and uppermost insulating layers 111a and 111b among the plurality of insulating layers 111 may be solder resist layers protecting the lower wiring layer 112 from external physical/chemical damage. The solder resist layers may include an insulating material and may be formed using, for example, prepreg, ABF, FR-4, BT, or photo solder resist (PSR). In addition, for convenience of description, only five insulating layers 111 are illustrated in the drawings, but exemplary embodiments of the present inventive concept are not limited thereto. According to an exemplary embodiment of the present inventive concept, the number of insulating layers 111 may be less or greater than What is illustrated in the drawings. In addition, as an example, a core insulating layer 111c positioned in the middle among the plurality of insulating layers 111 may be thicker than the insulating layers 111 stacked on and below the insulating layer 111. For example, the core insulating layer 111c may be disposed between the uppermost insulating layer 111b and the lowermost insulating layer 111a and may be thicker than the uppermost insulating layer 111b and the lowermost insulating layer 111a. The core insulating layer 111c may increase rigidity of the substrate, thereby suppressing warpage of the substrate. The core insulating layer 111c may be formed using, for example, a copper clad laminate (CCL), an unclad CCL, a glass substrate, a ceramic substrate, or the like. According to an exemplary embodiment of the present inventive concept, the lower substrate 110 might not include the core insulating layer 111c (refer to the embodiment of FIG. 8).

The lower wiring layer 112 may include a metallic material including, for example, copper (Cu), aluminum (Al), silver (Ag), tin (Sn), gold (Au), nickel (Ni), lead (Ph), titanium (Ti), or alloys thereof. The lower wiring layer 112 may include, for example, a ground (GND) pattern, a power (PWR) pattern, and a signal (S) pattern. The signal (S) pattern may provide a path through which various signals, excluding the ground (GND) pattern and the power (PWR) pattern, for example, a data signal, are transmitted/received. The lower wiring layer 112 may be provided as a plurality of lower wiring layers 112 respectively disposed on the plurality of insulating layers 111. The plurality of lower wiring layers 112 may be electrically connected to each other through the interconnection via 113. The lower wiring layer 112 may include a landing pad on which the semiconductor chip 120, the connection structure 140, the connection bump 160, and the passive element 170 are mounted, respectively. The landing pad may be formed to have a different pitch according to a mounted object. In an example, the lowermost lower wiring layer 112 in contact with the connection bump 160 may be firmed to have a thickness greater than that of the lower wiring layers 112 thereon (e.g., upper lower wiring layers 112). The number of layers of the lower wiring layer 112 may be determined according to the number of the insulating layers 111 and may include more or fewer layers than those illustrated in the drawings.

The interconnection via 113 may be electrically connected to the lower wiring layer 112 and may include a signal via, a ground via, and a power via. The interconnection via 113 may include a metallic material, for example, copper (Cu), aluminum (Al), silver (Ag), tin (Sn), gold (Au), nickel (Ni), lead (Pb), titanium (Ti), or alloys thereof. For example, the interconnection via 113 may have a filled via in which a via hole is filled with a metallic material or a conformal via in which a metal material is formed on an inner wall of a via hole. The interconnection via 113 may be integrated with the lower wiring layer 112, but exemplary embodiments of the present inventive concept are not limited thereto.

The semiconductor chip 120 may be disposed on the lower substrate 110 and may be electrically connected to the lower wiring layer 112. The semiconductor chip 120 may be mounted on the lower substrate 110 in a flip-chip manner. The semiconductor chip 120 may be connected to the lower wiring layer 112 through metal bumps in the form of balls or posts. For example, the semiconductor chip 120 may be electrically connected to the lower wiring layer 112 through the solder bumps 12013, but the present inventive concept is not limited thereto. According to an exemplary embodiment of the present inventive concept, the semiconductor chip 120 may be directly connected to the lower wiring layer 112 or the interconnection via 113 without a separate bump or may be mounted on the lower substrate 110 by wire bonding. The semiconductor chip 120 may include, for example, silicon (Si), germanium (Ge), or gallium arsenide (GaAs), and various types of integrated circuits may be formed. For example, an integrated circuit may be a processor chip such as a central processor (e.g., CPU), a graphics processor (e.g., GPU), a field programmable gate array (FPGA), an application processor (AP), a digital signal processor, a cryptographic processor, a microprocessor, and a microcontroller, but the present inventive concept is not limited thereto, and may be a logic chip such as an analog-to-digital converter, an application-specific IC (ASIC) or may be a memory chip such as volatile memory (e.g., DRAM), non-volatile memory (e.g., ROM and flash memory), etc.

The upper substrate 130 may be a redistribution substrate that provides a redistribution layer on an upper or rear surface of the semiconductor package 100A and may be referred to as an interposer substrate positioned between a lower package and an upper package in a package-on-package (POP) structure. The upper substrate 130 may be disposed on the semiconductor Chip 120 and include an insulating layer (also referred to as an upper insulating layer) 131, an upper wiring layer 132, an interconnection via 133, and at least one dummy structure 135. The upper insulating layer 131, the upper wiring layer 132, and the interconnection via 133 may have characteristics, features, and/or elements the same as or similar to those of the lower insulating layer 111, the lower wiring layer 112, and the interconnection via 113 of the lower substrate 110, and thus, redundant descriptions thereof may be omitted. The upper insulating layer 131 may be provided as a plurality of insulating layers 131a, 131b, and 131c. For example, the upper insulating layer 131 may include a core layer 131c and solder resist layers 131a and 131b covering the core layer 131c. The solder resist layers 131a and 131b may include openings exposing at least a portion of the upper wiring layer 132, respectively.

In the present embodiment of the present inventive concept, warpage characteristics of the semiconductor package 100A may be improved by adjusting the second CTE of the upper substrate 130 to a level similar to that of the first CTE of the lower substrate 110 using the dummy structure 135. For example, the lower wiring layer 112 of the lower substrate 110 may be provided as a plurality of lower wiring layers 112 located on different levels from each other. Further, the upper wiring layer 132 of the upper substrate 130 may be provided as a plurality of upper wiring layers 132 located on different levels from each other, and the number of the plurality of upper wiring layers 132 may be less than the number of layers of the plurality of lower wiring layers 112. In addition, a thickness of the core layer 111c of the lower substrate 110 may be greater than a thickness of the core layer 131c of the upper substrate 130. Such material and structural differences between the lower substrate 110 and the upper substrate 130 may cause a difference in physical properties, for example, a difference in CTE, between the upper substrate 130 and the lower substrate 110. According to an exemplary embodiment of the present inventive concept, the CTE of the upper substrate 130 may be lowered by arranging the dummy structures 135 in or on the upper substrate 130. For example, the dummy structures 135 may be arranged in a matrix form including rows and columns in or on the upper substrate 130. Accordingly, the difference in the CTE between the upper substrate 130 and the lower substrate 130 may be reduced, and as a result, warpage of the semiconductor package may be controlled. However, the arrangement form of the dummy structures 135 is not limited to the form illustrated in FIG. 1B or the like.

The dummy structure 135 may be a chip-shaped structure having a third CTE less than each of the first CTE of the lower substrate 110 and the second CTE of the upper substrate 130. For example, the dummy structure 135 may be a silicon dummy chip including silicon (Si), and the third CTE of the dummy structure 135 may range from about 1 ppm/° C. to about 20 ppm/° C., from about 1 ppm/° C. to about 10 ppm/° C., from about 0.1 ppm/° C. to about 5 ppm/° C., and the like. The dummy structure 135 may have a thickness 135H greater than that of the upper wiring layer 132. For example, the dummy structure 135 may have the thickness 135H, ranging from about 50 μm to about 100 μm in the first direction (e.g., the Z-axis direction), and a width 135W, ranging from about 0.1 mm to about 2 mm in the second direction (e.g., the X-axis and Y-axis directions).

In an exemplary embodiment of the present inventive concept, the dummy structure 135 may be disposed (e.g., buried) in the insulating layer 131 of the upper substrate 130. For example, the dummy structure 135 may be disposed in a through-hole TH penetrating through the core layer 131c of the upper substrate 130 and may be covered by the solder resist layers 131a and 131b covering the core layer 131c. The dummy structure 135 may be provided as a plurality of dummy structures 135 disposed in each of the plurality of through-holes TH. At least some of the dummy structures 135 may be disposed inside a chip region 120R overlapping the semiconductor chip 120 in the first direction (e.g., the Z-axis direction), and the others (or, e.g., the remainder) of the dummy structures 135 may be disposed outside the chip region 120R so that signals generated by the semiconductor chip 120 may be effectively transmitted to the upper substrate 130. For example, the plurality of dummy structures 135 may be generally distributed in the upper substrate 130 to control warpage of the upper substrate 130, and may be intensively distributed in a position overlapping the chip region 120R to improve the chip region 120R and to increase heat dissipation characteristics of the package. In the present inventive concept, the position and arrangement of the dummy structure for controlling the CTE of the upper substrate are not limited to those illustrated in FIGS. 1A and 1B.

The connection structure 140 may be disposed between the lower substrate 110 and the upper substrate 130 to electrically connect the lower substrate 110 and the upper substrate 130. The connection structure 140 may extend in a vertical direction (e.g., the Z-axis direction) between the lower substrate 110 and the upper substrate 130 to provide a vertical connection path electrically connecting the lower wiring layer 112 and the upper wiring layer 132. For example, portions of the upper wiring layer 132 may overlap the connection structures 140. For example, the connection structure 140 may have a spherical or ball shape formed of a low-melting-point metal, for example, tin (Sn), indium (In), bismuth (Bi), antimony (Sb), copper (Cu), sifter (Ag), zinc (Zn), and lead (Pb) or alloys (e.g., Sn—Ag—Cu) thereof.

In an exemplary embodiment of the preset inventive concept, the dummy structures 135 disposed outside of the chip region 120R may be disposed between the connection structures 140.

The encapsulant 150 may fill a space between the lower substrate 110 and the upper substrate 130 to encapsulate at least a portion of each of the semiconductor chip 120 and the connection structure 140. The encapsulant 150 may include, for example, a thermosetting resin such as an epoxy resin, a thermoplastic resin such as polyimide, or a prepreg including an inorganic filler and/or glass fiber, Ajinomoto build-up film (ABF), FR-4, bismaleimide triazine (BT), and/or epoxy molding compound (EMC). The encapsulant 150 may have a molded underfill (MUF) structure integrally formed with an underfill resin between the semiconductor chip 120 and the lower substrate 110, but the present inventive is not limited thereto. In an exemplary embodiment of the present inventive concept, the encapsulant 150 may have a capillary underfill (CU) structure in which the underfill resin below the semiconductor chip 120 is separated.

The connection bump 160 may be disposed below the lower substrate 110 and may be electrically connected to the lower wiring layer 112. The connection bump 160 may physically and/or electrically connect the semiconductor package 100A to an external device. The connection bump 160 may include a conductive material and may have a ball, pin, lead shape or the like. For example, the connection bump 160 may be a solder ball. In an example, at least one passive element 170 disposed adjacent to the connection bump 160 may be disposed below the lower substrate 110. The passive element 170 may include, for example, a capacitor such as a multilayer ceramic capacitor (MLCC) or a low inductance chip capacitor (MCC), an inductor, and beads. In an exemplary embodiment of the present inventive concept, the passive element 170 may be a land-side capacitor (LSC). However, the present inventive concept is not limited thereto, and according to an exemplary embodiment of the present inventive concept, the passive element 170 may be a die-side capacitor (DSC) mounted on an upper surface of the lower substrate 110 or an embedded type embedded in the lower substrate 110.

In an exemplary embodiment of the present inventive concept, the passive element 170 may include a silicon chip, and may be electrically connected to the upper wiring layer 132 through the lowering wiring layer 112 and the connection structure 140.

Hereinafter, the warpage improvement effect according to the present inventive concept will be described with reference to FIG. 2.

Figure 2:
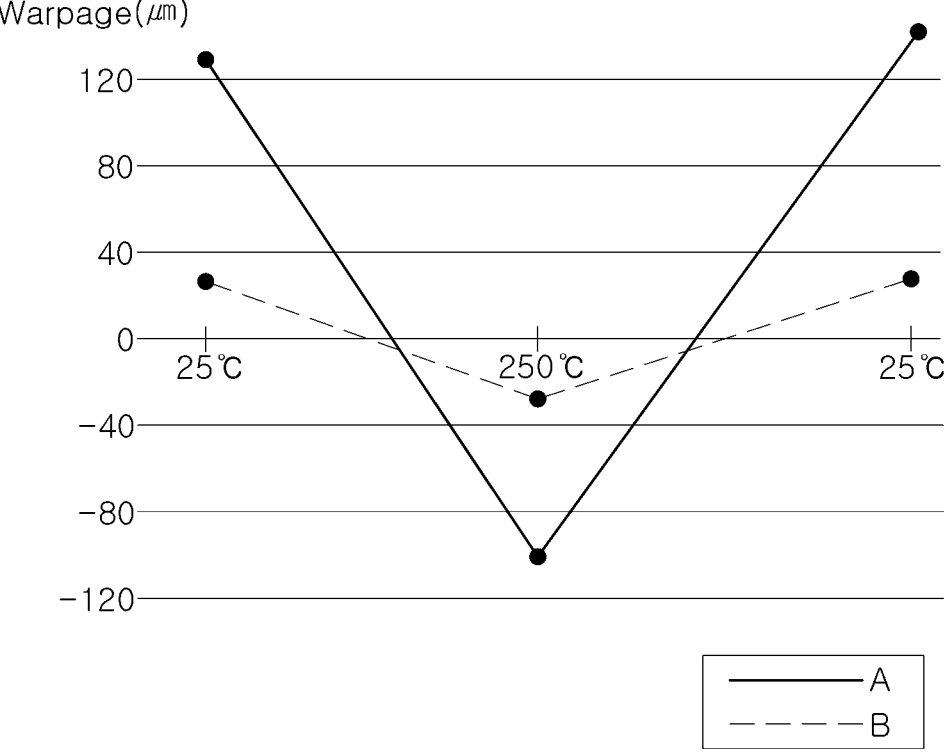
FIG. 2 is a graph illustrating a change in warpage of a semiconductor package according to the presence or absence of a dummy structure.

FIG. 2 is a graph illustrating a change in warpage of a semiconductor package according to the presence or absence of a dummy structure. FIG. 2 illustrates a warpage graph A of a comparative example without a dummy structure and a warpage graph B of an exemplary embodiment of the present inventive concept including a dummy structure.

Referring to FIG. 2, the graph A. of the comparative example represents warpage of a semiconductor package at room temperature of 25° C. and at a high temperature of 250° C. when a CTE of the lower substrate is about 8.9 ppm/° C., and a CTE of the upper substrate is about 9.2 ppm/° C. In this case, it can be seen that the warpage is 120 μm or more (about 139 μm) at room temperature (25° C.) and at the warpage is −80 μm or less (about −92 μm) at the high temperature (250° C.), indicating that the warpage characteristics are not good or have deteriorated. In addition, the graph B of an exemplary embodiment of the present inventive concept represents warpage of a semiconductor package at room temperature of 25° C. and at the high temperature of 250° C. when a CTE of the lower substrate is about 8.9 ppm/° C. and a CTE of the upper substrate is about 8.9 ppm/° C. In this case, it can be seen that the warpage is about 80 μm or less at room temperature (25° C.) and the warpage at the high temperature (250° C.) is about −80 μm or more, indicating that the warpage characteristics are significantly improved. As described above, according to the present inventive concept, the warpage characteristics of the semiconductor package may be improved by adjusting the CTE of the upper substrate 130 to a level similar to that of the lower substrate 110 using the dummy structure 135.

Figure 3:
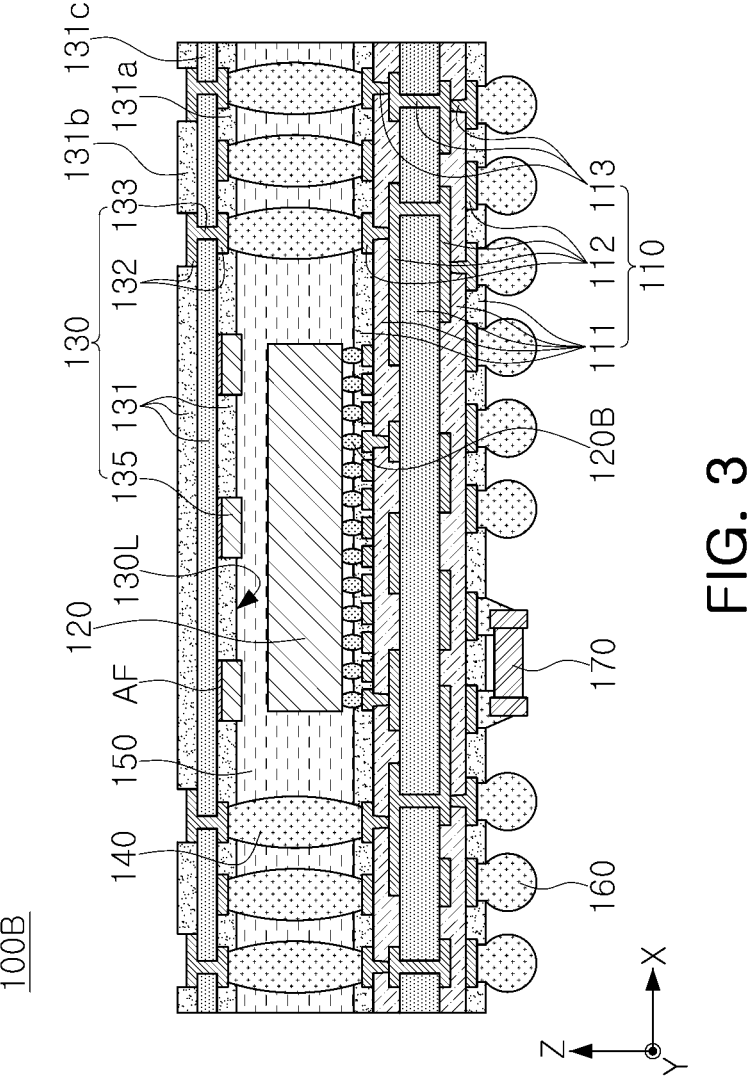
FIG. 3 is a cross-sectional view illustrating a semiconductor package according to an exemplary embodiment of the present inventive concept.
Figure 4:
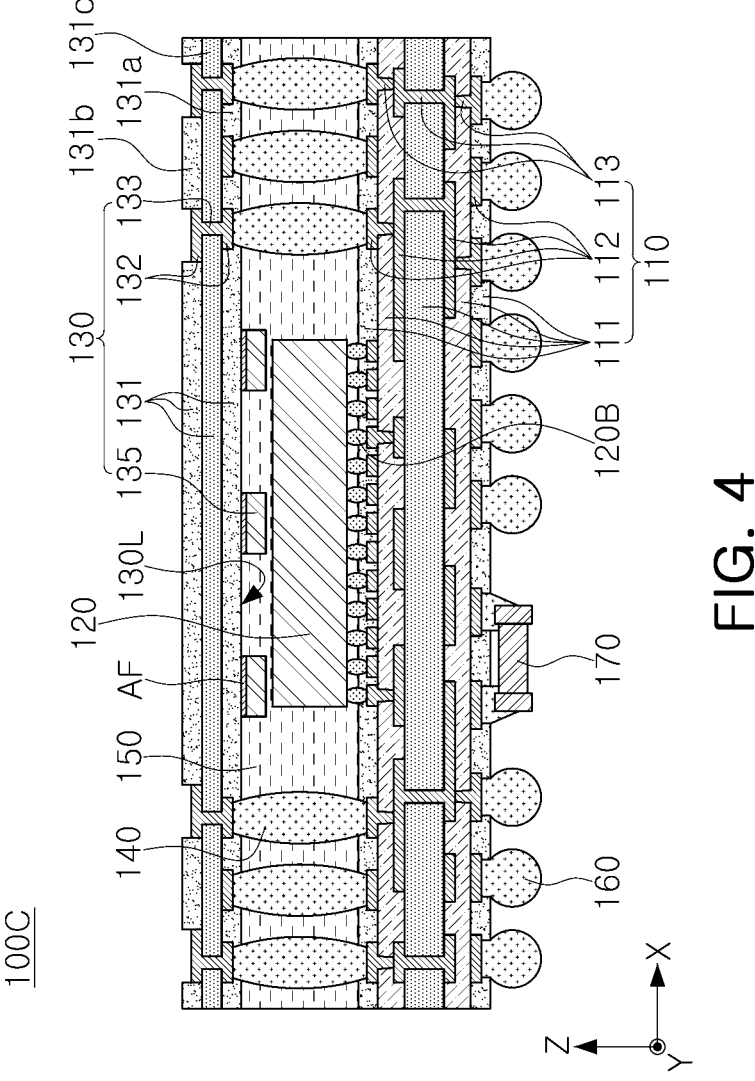
FIG. 4 is a cross-sectional view illustrating a semiconductor package according to an exemplary embodiment of the present inventive concept.

FIG. 3 is a cross-sectional view illustrating a semiconductor package 100B according to an exemplary embodiment of the present inventive concept, and FIG. 4 is a cross-sectional view illustrating a semiconductor package 100C according to an exemplary embodiment of the present inventive concept.

First, referring to FIG. 3, the semiconductor package 100B according to an exemplary embodiment of the present inventive concept has characteristics the same as or similar to those of the semiconductor package 100A of FIGS. 1A and 1B, except a dummy structure 135 partially disposed in the insulating layer 131 of the upper substrate 130. In an exemplary embodiment of the present inventive concept, the upper substrate 130 includes solder resist layers 131a and 131b exposing at least a portion of the upper wiring layer 132, and the dummy structure 135 may be disposed such that at least a portion thereof is disposed in the solder resist layer 131a or 131b, For example, the dummy structure 135 may be attached to the core layer 131c of the upper substrate 130 by an adhesive layer AF. The adhesive layer AF may include, for example, a die attach film (DAF), but the present inventive concept is not limited thereto. For example, the dummy structure 135 may protrude, relative to a lower surface 130L of the upper substrate 130, toward the semiconductor chip 120. For example, the dummy structure 135 may protrude beyond the solder resist layer 131a. In this case, the dummy structure 135 disposed at a position overlapping the semiconductor chip 120 may secure a space between the upper substrate 130 and the semiconductor chip 120 to be filled with the encapsulant 150. In addition, in the drawings, the dummy structure 135 is disposed below the upper substrate 130 (e.g., the core layer 131c), but according to an exemplary embodiment of the present inventive concept, the dummy structure 135 may be disposed on the upper substrate 130.

Next, referring to FIG. 4, a semiconductor package 1000 according to an exemplary embodiment of the present inventive concept may have characteristics, features, and/or elements the same as or similar to those of the semiconductor package 100A of FIGS. 1A and 1B, except the dummy structure 135 attached on the insulating layer 131 of the upper substrate 130. In an exemplary embodiment of the present inventive concept, the upper substrate 130 may include solder resist layers 131*a* and 131*b* exposing at least a portion of the upper wiring layer 132, and the dummy structure 135 may be attached on the solder resist layer 131*a* or 131*b*. For example, the dummy structure 135 may be directly attached to the solder resist layer 131*a* or 131*b*. In this case, similar to that described with reference to FIG. 3, the dummy structure 135 may protrude, relative to the lower surface 130L of the upper substrate 130, to secure a space between the upper substrate 130 and the semiconductor chip 120. For example, the dummy structure 135 may protrude beyond the lower surface 130L of the upper substrate 130.

Figure 5A:
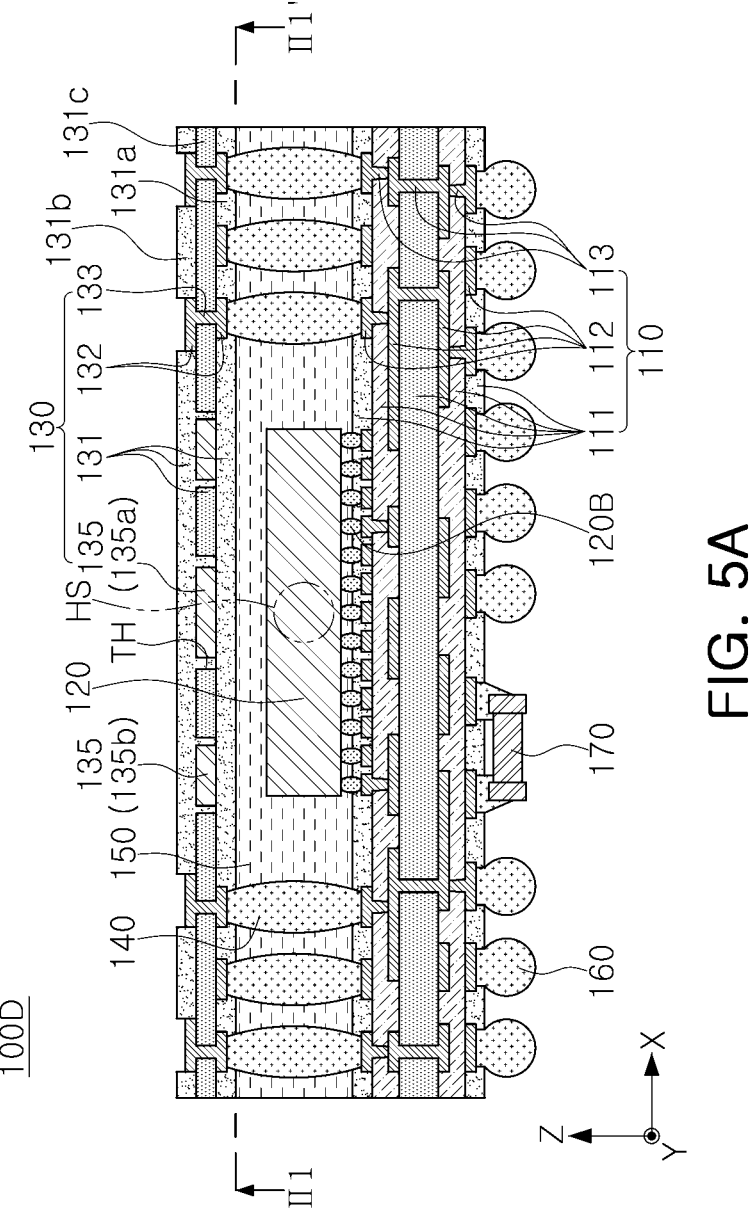
FIG. 5A is a cross-sectional view illustrating a semiconductor package according to an exemplary embodiment of the present inventive concept.
Figure 5B:
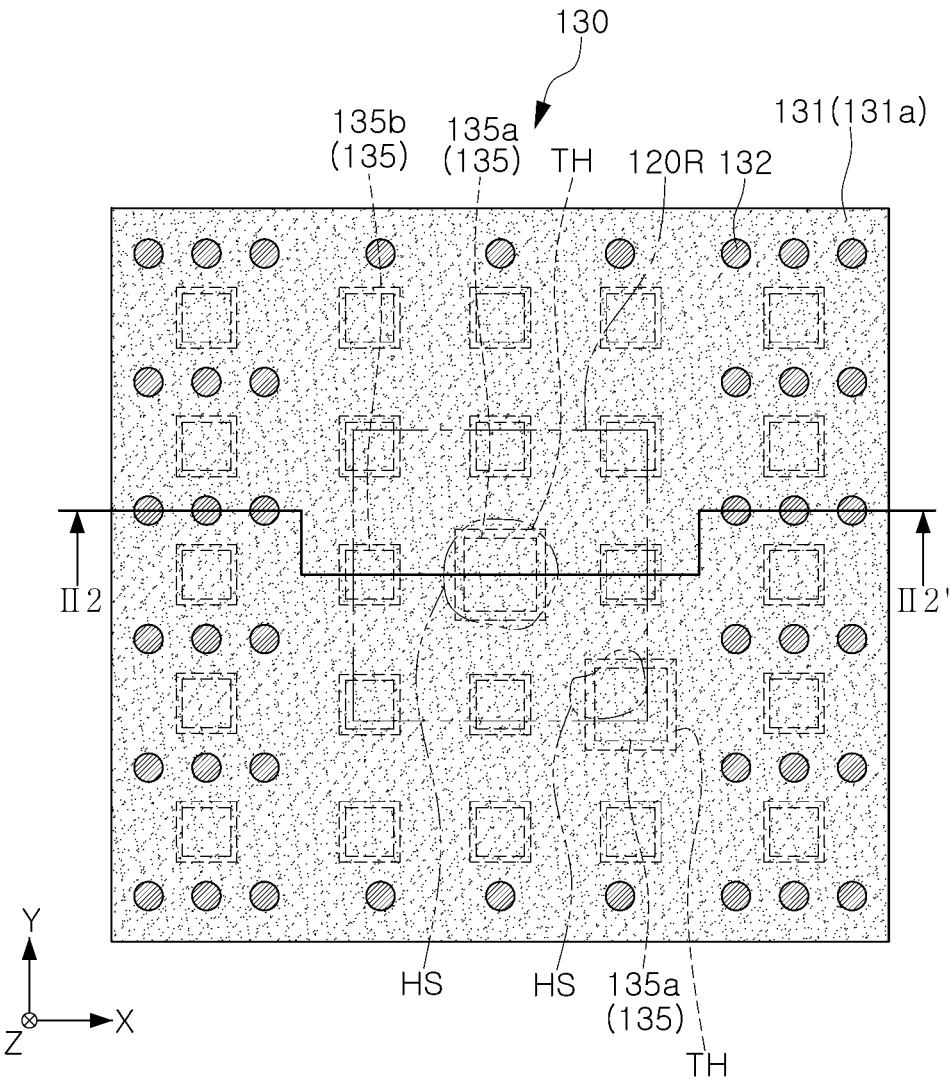
FIG. 5B is a plan view illustrating a lower surface of the upper substrate taken along line of FIG. 5A.

FIG. 5A is a cross-sectional view illustrating a semiconductor package 100D according to an exemplary embodiment of the present inventive concept, and FIG. 5B is a plan view illustrating a lower surface of the upper substrate 130, taken along line II1-II1' of FIG. 5A. FIG. 5A illustrates a cross-section of the upper substrate 130, taken along line II2-II2' of FIG. 5B.

Referring to FIGS. 5A and 5B, the semiconductor package 100D according to an exemplary embodiment of the present inventive concept may have characteristics, features, and/or elements the same as or similar to those of the semiconductor packages of FIGS. 1A to 4, except the dummy structure 135 disposed to overlap a hot spot HS of the semiconductor chip 120 to increase heat dissipation. For example, the semiconductor chip 120 may be a system on chip (SoC) in which a plurality of functions are implemented in one integrated circuit (IC) or chip, and the semiconductor chip 120 may include a hot spot HS having a relatively high heating value according to a function of an IC, In an exemplary embodiment of the present inventive concept, the dummy structure 135 may be disposed to overlap the hot spot HS of the semiconductor chip 120 in the vertical direction (e.g., the Z-axis direction) to increase heat dissipation of the semiconductor package 100D. For example, the dummy structure 135 may be provided as a plurality of dummy structures 135 spaced apart from each other, and at least some of the plurality of dummy structures 135 may be disposed in a position overlapping the hot spot HS or the at least some of the dummy structures 135 overlapping the hot spot 1-IS may have a relatively large area. For example, all of the dummy structures 135 may overlap the semiconductor chip 120, and one dummy structure 135 may directly overlap the hot spot HS. However, the present inventive concept is not limited thereto.

As an example, the plurality of dummy structures 135 may include a first dummy structure 135*a* and a second dummy structure 135*b*. The first dummy structure 135*a* may overlap the hotspot HS, and the second dummy structure 135*b* might not overlap the hotspot HS. In this case, the first dummy structure 135*a* may have an area covering the hot spot HS on the X-Y plane. For example, the first dummy structure 135*a* may cover an entirety of the hot spot HS in the first direction (e.g., Z-axis direction). Accordingly, the first dummy structure 135*a* may have a planar area greater than that of the second dummy structure 135*b*. However, the present inventive concept is not limited thereto. For example, the second dummy structure 135*b* may have planar area greater than or equal to that of the first dummy structure 135*a*.

Figure 6A:
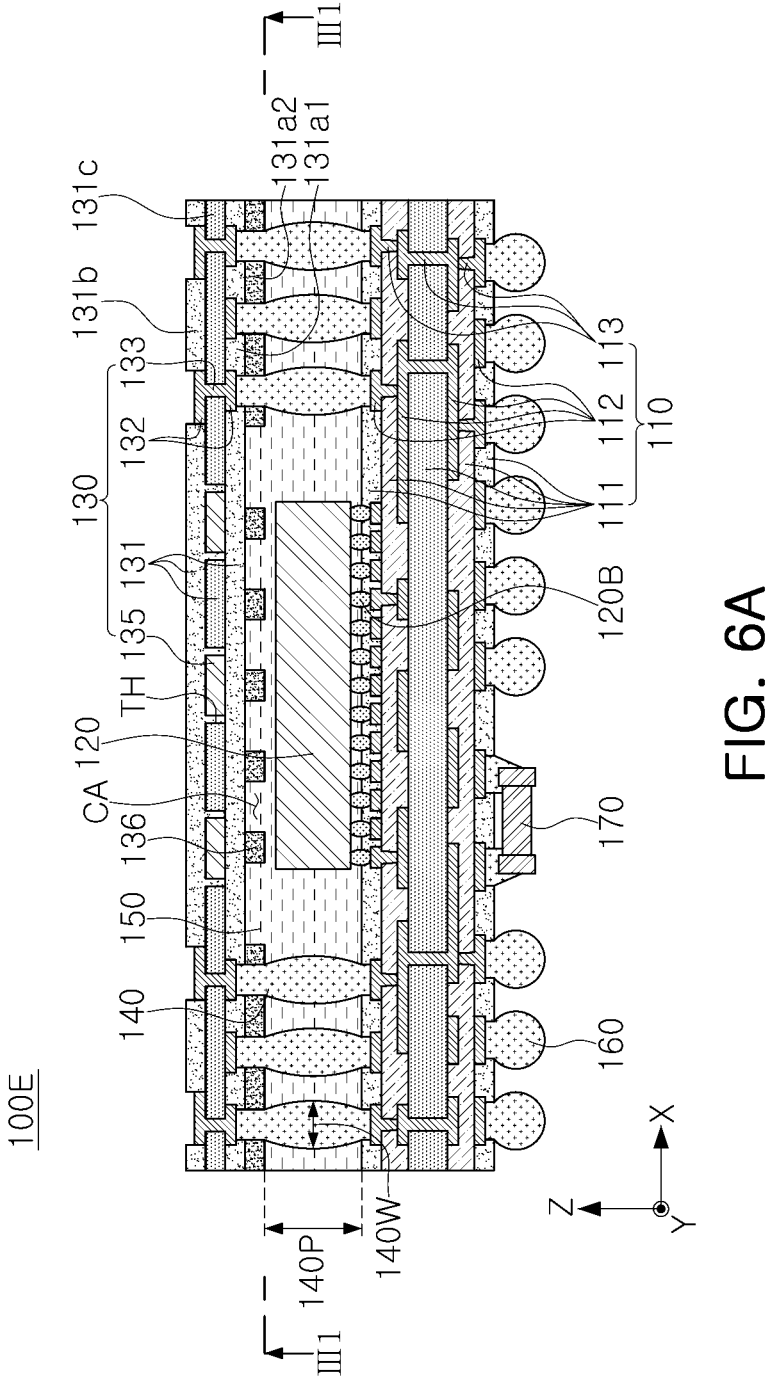
FIG. 6A is a cross-sectional view illustrating a semiconductor package according to an exemplary embodiment of the present inventive concept.
Figure 6B:
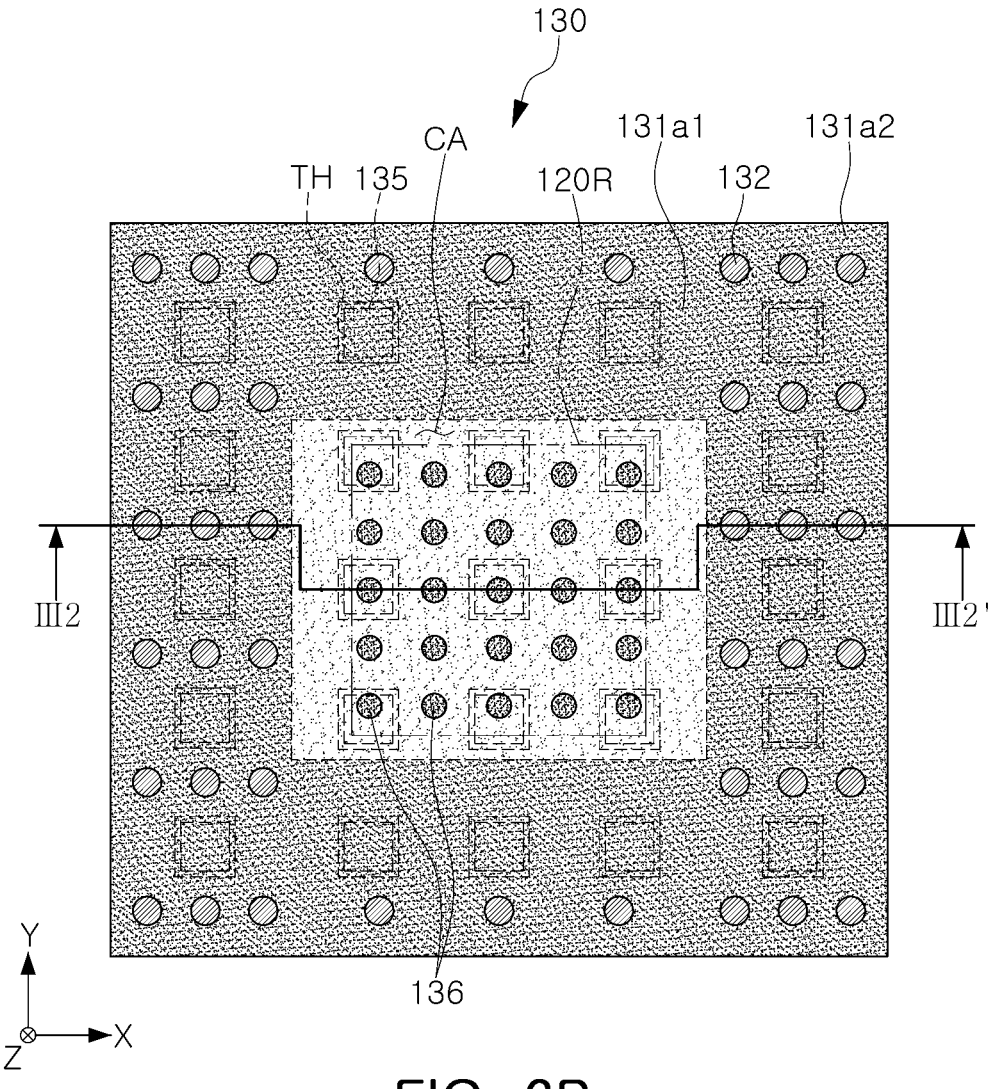
FIG. 6B is a plan view illustrating a lower surface of an upper substrate taken along line of FIG. 6A.

FIG. 6A is a cross-sectional view illustrating a semiconductor package 100E according to an exemplary embodiment of the present inventive concept, and FIG. 6B is a plan view illustrating a lower surface of the upper substrate 130 taken along line III1-III1' of FIG. 6A. FIG. 6A illustrates a cross-section of the upper substrate 130 taken along line III2-III2' of FIG. 6B.

Referring to FIGS. 6A and 6B, a semiconductor package 100E according to an exemplary embodiment of the present inventive concept may have characteristics, features, and/or elements the same as or similar to those of the semiconductor packages of FIGS. 1A, to 5B, except for a cavity CA and a patch structure 136 below the upper substrate 130. In an exemplary embodiment of the present inventive concept, the upper substrate 130 may include a first solder resist layer 131*a*1 and a second solder resist layer 131*a*2, The first solder resist layer 131*a*1 may be disposed below the core layer 131*c*, and the second solder resist layer 131*a*2 may disposed below the first solder resist layer 131*a*1 and may surround an upper portion of the connection structure 140. Here, the second solder resist layer 131*a*2 may include a cavity CA and a plurality of patch structures 136. The cavity CA may overlap the semiconductor chip 120 in the first direction (e.g., the Z-axis direction), and the plurality of patch structures 136 may protrude toward the semiconductor chip 120 within the cavity CA. For example, the plurality of patch structures 136 may be disposed on the first solder resist layer 131*a*1 and within the cavity CA.

The cavity CA may reduce a joint pitch 140P between the upper substrate 130 and the lower substrate 110 and may reduce a ball size 140W of the connection structure 140, and as a result, a height of the semiconductor package 100E may be increased and the connection structure 140 having a fine pitch may be implemented. For example, the cavity CA may have a width greater than a width of the semiconductor chip 120 in the second direction (e.g., the X-axis direction or Y-axis direction). Here, the joint pitch may be a height of the connection structure 140 disposed between the upper substrate 130 and the lower substrate 110. The ball size may be a maximum width of the connection structure 140 in a horizontal direction (e.g., the X-axis direction or the Y-axis direction), and the fine pitch may be an interval between the connection structures 140 adjacent to each other.

The plurality of patch structures 136 may control warpage of the upper substrate 130. For example, when the upper substrate 130 is excessively bent during a manufacturing process of the semiconductor package 100E, the plurality of patch structures 136 may be in contact with the upper surface of the semiconductor chip 120 to support the upper substrate 130 to control bowing or bending of the substrate 130 and reduce no-wet risk of the connection structure 140 disposed on an outer side of the semiconductor chip 120. Accordingly, according to an exemplary embodiment of the present inventive concept, some of the patch structures 136 may contact the upper surface of the semiconductor chip 120. The plurality of patch structures 136 may be formed in the same step as that of the cavity CA. For example, the cavity CA and the plurality of patch structures 136 may be simultaneously formed by patterning the second solder resist layer 131*a*2. According to an exemplary embodiment of the present inventive concept, the plurality of patch structures 136 may be omitted. For example, as in the exemplary embodiments of FIGS. 3 and 4, when a space between the semiconductor chip 120 and the upper substrate 130 is secured by the dummy structure 135, the plurality of patch structures 136 may be omitted.

Figure 7A:
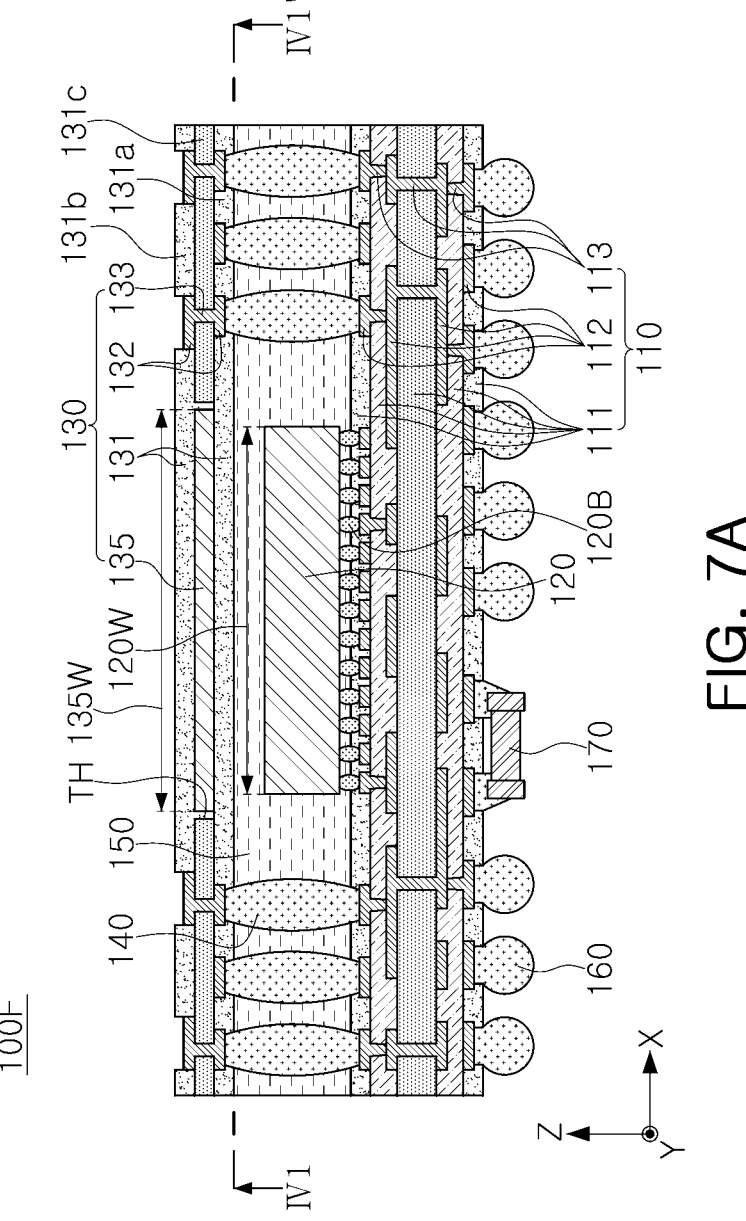
FIG. 7A is a cross-sectional view illustrating a semiconductor package according to an exemplary embodiment of the present inventive concept.
Figure 7B:
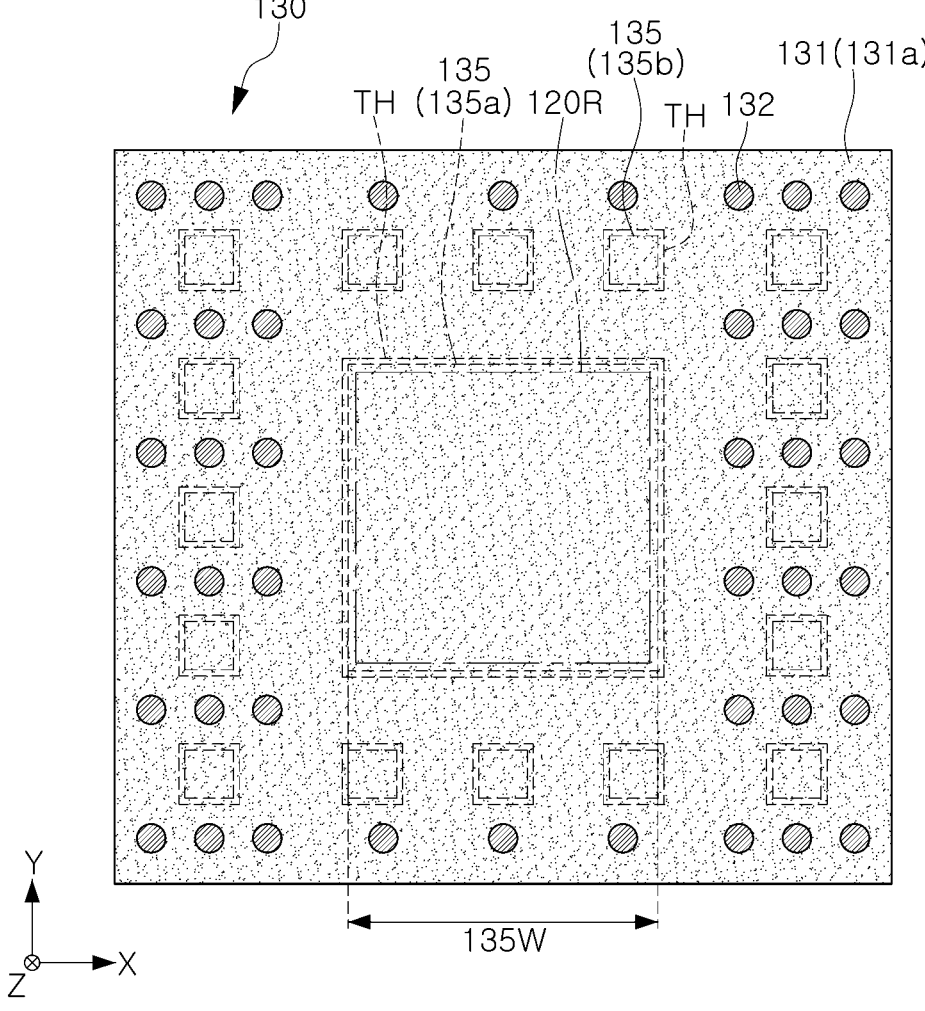
FIG. 7B is a plan view illustrating a lower surface of an upper substrate taken along line IV1-IV1' of FIG. 7A.

FIG. 7A is a cross-sectional view illustrating a semiconductor package 100F according to an exemplary embodiment of the present inventive concept, and FIG. 7B is a plan view illustrating a lower surface of the upper substrate 130 taken along line IV1-IV1' of FIG. 7A.

Referring to FIGS. 7A and 7B, the semiconductor package 100F according to an exemplary embodiment of the present inventive concept may have characteristics, features, and/or elements the same as or similar to those of the semiconductor packages of FIGS. 1A to 6B, except at least one dummy structure 135 having a planar area greater than the planar area of the semiconductor chip 120. In an exemplary embodiment of the present inventive concept, a first dummy structure 135a overlapping the semiconductor chip 120 may have a width 135W greater than a width 120W of the semiconductor chip 120 and may be disposed to cover an upper surface of the semiconductor chip 120. In this case, the second dummy structure 135b not overlapping the semiconductor chip 120 may be disposed around the first dummy structure 135a in consideration of the CTE of the upper substrate 130, and the second dummy structure 135b may have a relatively small size. For example, the second dummy structure 135b may have a size smaller than that of the first dummy structure 135a.

Figure 8:
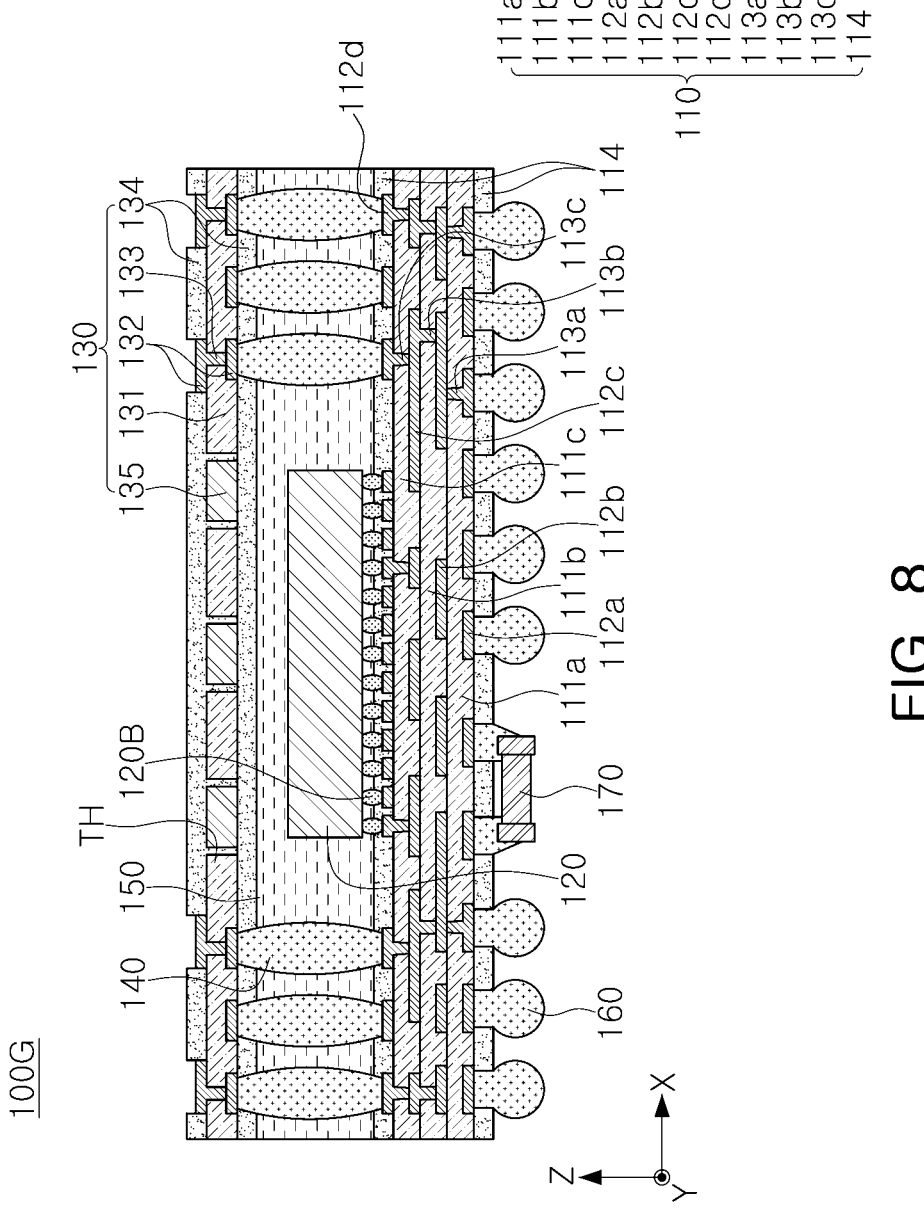
FIG. 8 is a cross-sectional view illustrating a semiconductor package according to an exemplary embodiment of the present inventive concept.

FIG. 8 is a cross-sectional view illustrating a semiconductor package 100G according to an exemplary embodiment of the present inventive concept.

Referring to FIG. 8, the semiconductor package 100G according to an exemplary embodiment of the present inventive concept includes FIGS. 1A to 7 and may have characteristics, features, and/or elements the same as or similar to those described above with reference to FIGS. 1A to 7, except for the lower substrate 110 and/or the upper substrate 130 not including a core insulating layer. For example, the lower substrate 110 may include a first lower wiring layer 112a, a first lower insulating layer 111a, a second lower wiring layer 112b, a second lower insulating layer 111b, a third lower wiring layer 112c, third lower insulating layer 111c, a fourth lower wiring layer 112d, and first to third layer interconnection vias 113a, 113b, and 113c. The first lower insulating layer 111a covers the first lower wiring layer 112a, and the second lower wiring layer 112b is disposed on the first lower insulating layer 111a. The second lower insulating layer 111b is disposed on the first lower insulating layer 111a and covers the second lower wiring layer 112b. The third lower wiring layer 112c is disposed on the second lower insulating layer 111b. The third lower insulating layer 111c is disposed on the second lower insulating layer 111b and covers the third lower wiring layer 112c. The fourth lower wiring layer 112d is disposed on the third lower insulating layer 111c, and the first to third lower interconnection vias 113a, 113b, and 113c respectively pass through the first to third lower insulating layers 111a, 111b, and 111c to electrically connect the first to fourth lower wiring layers 112a, 112b, 112c, and 112d to each other. In an example, the first to third lower insulating layers 111a, 111b, and 111c may include a photosensitive resin. (e.g., PID), and compared to a substrate including a core insulating layer, a lower substrate 110 may be formed to be thin and to have the lower wiring layers 112a, 112b, 112c, and 112d with a fine pitch. The number of the lower insulating layers 111a, 111b, and 111c and the lower wiring layers 112a, 112b, 112c, and 112d is not particularly limited to what is illustrated in FIG. 8, and the semiconductor package may include more or fewer layers than those illustrated in the drawings. In addition, solder resist layers 114 may be disposed below the first lower insulating layer 111a and on the third lower insulating layer 111c, respectively. Similarly to the lower substrate 110, the upper substrate 130 may be formed by stacking an insulating layer 131 and a solder resist layer 134. For example, the insulating layer 131 may be stacked using a photosensitive resin, and the solder resist layer 134 may cover the upper wiring layer 132. For example, the insulating layer 131 may be disposed between solder resist layers 134. According to the present embodiment, a thickness of the lower substrate 110 and the upper substrate 130 may be reduced, and an overall thickness of the semiconductor package 100G may be reduced.

Figure 9:
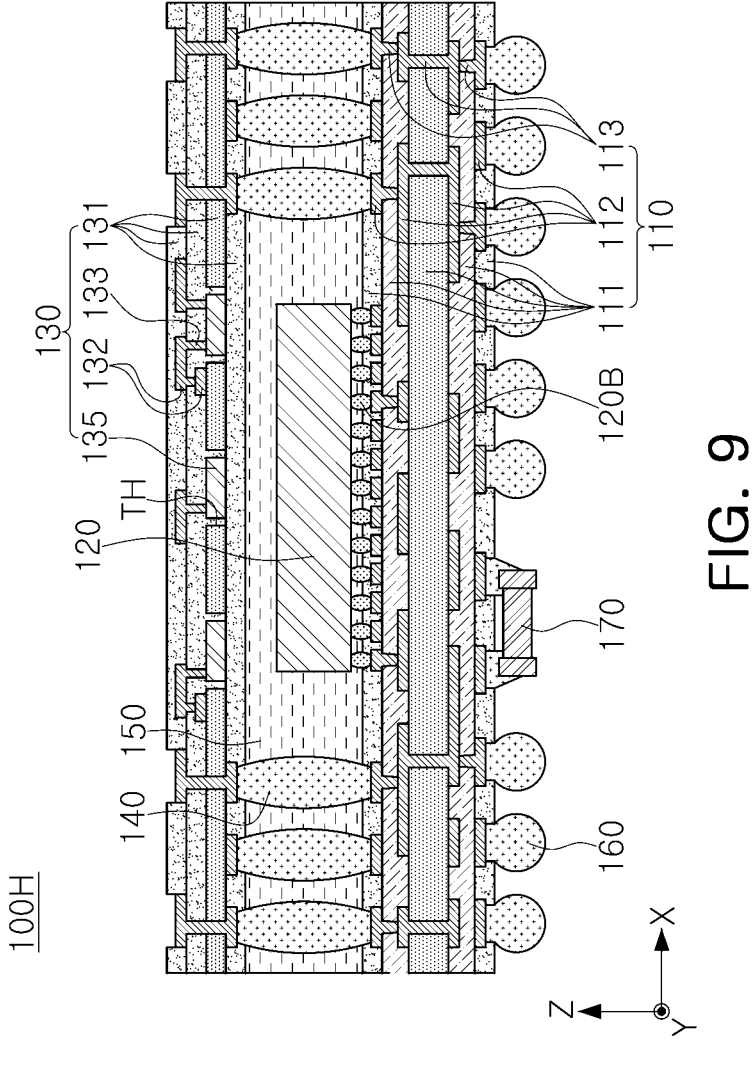
FIG. 9 is a cross-sectional view illustrating a semiconductor package according to an exemplary embodiment of the present inventive concept.

FIG. 9 is a cross-sectional view illustrating a semiconductor package 100H according to an exemplary embodiment of the present inventive concept.

Referring to FIG. 9, the semiconductor package 100H of an exemplary embodiment of the present inventive concept may have characteristics, features, and/or elements the same as or similar to those of the semiconductor package illustrated in FIGS. 1 to 8, except for the dummy structure 135 being electrically connected to the upper wiring layer 132. For example, the dummy structure 135 may be electrically connected to the upper wiring layer 132 through the interconnection via 133. In this case, the dummy structure 135 may be a dummy chip electrically insulated from a power line and a signal line, but may include a passive element according to an exemplary embodiment of the present inventive concept. Passive elements may include, for example, capacitors, inductors, beads, and the like. For example, the dummy structure 135 may be a silicon capacitor in the fern of a chip having high capacitance. For example, the passive element of the dummy structure 135 may be electrically connected to the upper wiring layer 132.

Figure 10:
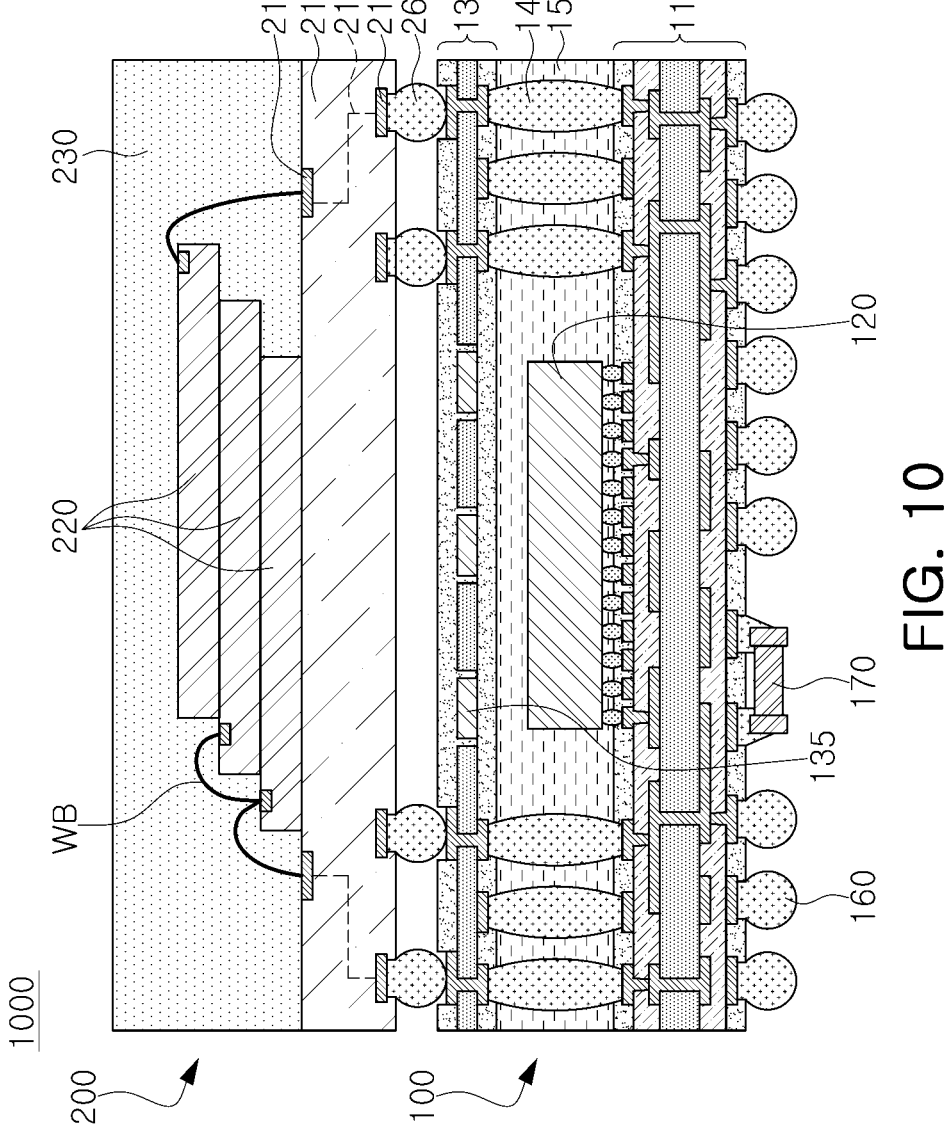
FIG. 10 is a cross-sectional view illustrating a semiconductor package according to an exemplary embodiment of the present inventive concept.

FIG. 10 is a cross-sectional view illustrating a semiconductor package 1000 according to an exemplary embodiment of the present inventive concept.

Referring to FIG. 10, the semiconductor package 1000 according to an exemplary embodiment of the present inventive concept may include a first package 100 and a second package 200. The first package 100 is illustrated to be the same as the semiconductor package 100A illustrated in FIGS. 1A and 1B, but may be understood as having characteristics, features, and/or elements the same as or similar to those of the semiconductor packages 100A, 100B, 100C, 100D, 100E, 100F, 100G, and 100H described above with reference to FIGS. 1A to 9.

The second package 200 may include a redistribution substrate 210, a second semiconductor chip 220, and a second encapsulant 230. The redistribution substrate 210 may include a lower pad 211 and an upper pad 212 that may be electrically connected to an external element or device. The lower pad 211 may be disposed in a lower portion of the redistribution substrate 210 and may be electrically connected to the external element or device. In addition, the redistribution substrate 210 may include a redistribution circuit 213 electrically connecting the lower pad 211 and the upper pad 212 to each other.

The second semiconductor chip 220 may be mounted on the redistribution substrate 210 by wire bonding or flip-chip bonding. For example, a plurality of second semiconductor chips 220 may be vertically stacked on the redistribution substrate 210 and may be electrically connected to the upper pad 212 of the redistribution substrate 210 by a bonding wire WB. In an example, the second semiconductor chip 220 may include a memory chip, and the first semiconductor chip 120 may include an application processor (AP) chip.

The second encapsulant 230 may include a material the same as or similar to that of the encapsulant 150 of the first package 100. The second package 200 may be physically and electrically connected to the first package 100 by a metal bump 260. The metal bump 260 may be electrically connected to the redistribution circuit 213 inside the redistribution substrate 210 through the lower pad 211 of the redistribution substrate 210. The metal bump 260 may include a low melting point metal, for example, tin (Sn) or an alloy including tin (Sn).

The semiconductor package 1000 according to an exemplary embodiment of the present inventive concept includes the first package 100 may have improved warpage characteristics and increased heat dissipation. Therefore, according to an exemplary embodiment of the present inventive concept, a POP structure having increased reliability may be implemented.

As set forth above, according to an exemplary embodiment of the present inventive concept, a semiconductor package having improved warpage by adjusting CTEs of an upper substrate and a lower substrate by using a dummy structure may be provided.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A semiconductor package comprising:
   a lower substrate including a lower wiring layer;
   a semiconductor chip disposed on the lower substrate and electrically connected to the lower wiring layer;
   an upper substrate disposed on the semiconductor chip and including a core layer, an upper wiring layer, a plurality of dummy structures, and a solder resist layer, wherein the core layer has through-holes, wherein the upper wiring layer is disposed on the core layer, wherein the plurality of dummy structures are respectively disposed in the through-holes and are electrically insulated from the upper wiring layer, and wherein the solder resist layer covers at least a portion of the upper wiring layer and extends in the through-holes and on the plurality of dummy structures;
   a connection structure disposed between the lower substrate and the upper substrate and electrically connecting the lower wiring layer and the upper wiring layer to each other;
   an encapsulant disposed between the lower substrate and the upper substrate and encapsulating at least a portion of each of the semiconductor chip and the connection structure; and
   a connection bump disposed on the lower substrate and electrically connected to the lower wiring layer.

2. The semiconductor package of claim 1, wherein the plurality of dummy structures are arranged in rows and columns and are disposed inside the upper substrate.

3. The semiconductor package of claim 1, wherein a first plurality of dummy structures of the plurality of dummy structures are disposed to not overlap the semiconductor chip.

4. The semiconductor package of claim 1, wherein the semiconductor chip includes a hot spot having a heating value in a plane area thereof, and at least one of the plurality of dummy structures is disposed to overlap the hot spot of the semiconductor chip.

5. The semiconductor package of claim 1, wherein the solder resist layer has an opening exposing at least a portion of the upper wiring layer.

6. The semiconductor package of claim 1, wherein the plurality of dummy structures have a thickness greater than a thickness of the upper wiring layer.

7. The semiconductor package of claim 1, wherein the plurality of dummy structures have a thickness ranging from about 50 μm to about 100 μm in a first direction that is perpendicular to an upper surface of the semiconductor chip.

8. The semiconductor package of claim 7, wherein the plurality of dummy structures have a width ranging from about 0.1 mm to about 2 mm in a second direction crossing the first direction.

9. The semiconductor package of claim 1, wherein the lower substrate has a first coefficient of thermal expansion (CTE), wherein the upper substrate has a second CTE, and wherein the plurality of dummy structures have a third CTE smaller than each of the first and second coefficients of thermal expansion.

10. The semiconductor package of claim 9, wherein a difference between the first CTE and the second CTE is about 10 ppm/° C. due to the plurality of dummy structures.

11. The semiconductor package of claim 9, wherein the third CTE of the plurality of dummy structures ranges from about 1 ppm/° C. to about 20 ppm/° C.

12. The semiconductor package of claim 1, wherein
   the lower substrate, the semiconductor chip, and the upper substrate are stacked on each other in a first direction,
   the lower substrate has a first thickness in the first direction, and
   the upper substrate has a second thickness less than the first thickness in the first direction.

13. The semiconductor package of claim 1, wherein
   the lower wiring layer is provided as a plurality of lower wiring layers disposed on different levels from each other,
   the upper wiring layer is provided as a plurality of upper wiring layers disposed on different levels from each other, and
   a number of the plurality of upper wiring layers is less than a number of the plurality of lower wiring layers.

14. A semiconductor package comprising:
   a lower substrate including a lower wiring layer;
   a semiconductor chip disposed on the lower substrate and electrically connected to the lower wiring layer;
   an upper substrate disposed on the semiconductor chip and including an insulating layer, an upper wiring layer, and a plurality of dummy structures, wherein the upper wiring layer is disposed on the insulating layer, and the plurality of dummy structures is electrically insulated from the upper wiring layer; and
   connection structures disposed to be adjacent to the semiconductor chip disposed between the lower substrate and the upper substrate and electrically connecting the lower wiring layer and the upper wiring layer to each other,
   wherein a first plurality of dummy structures of the plurality of dummy structures are disposed in a position overlapping the semiconductor chip and a second plurality of dummy structures of the plurality of dummy structures are disposed to not overlap the semiconductor chip.

15

16

15. The semiconductor package of claim 14, wherein the plurality of dummy structures include a silicon (Si) dummy, the upper substrate includes a solder resist layer disposed on the insulating layer and exposing at least a portion of the upper wiring layer, and the plurality of dummy structures are covered by the solder resist layer.

16. The semiconductor package of claim 14, wherein the upper substrate includes a solder resist layer disposed on the insulating layer and exposing at least a portion of the upper wiring layer, and the plurality of dummy structures are attached to the solder resist layer.

17. The semiconductor package of claim 14, wherein the upper substrate includes a solder resist layer disposed on the insulating layer and at least partially surrounding upper portions of the connection structures, and the solder resist layer has a cavity overlapping the semiconductor chip.

18. The semiconductor package of claim 17, wherein the cavity has a width greater than a width of the semiconductor chip.

19. A semiconductor package comprising:

a lower substrate including a lower wiring layer;

a semiconductor chip disposed on the lower substrate and electrically connected to the lower wiring layer;

an upper substrate disposed on the semiconductor chip and including an insulating layer and an upper wiring layer disposed on the insulating layer;

a connection structure disposed between the lower substrate and the upper substrate and electrically connecting the lower wiring layer to the upper wiring layer; and a dummy structure embedded in the insulating layer of the upper substrate, wherein the dummy structure includes a passive element including a silicon chip electrically connected to the upper wiring layer.

* * * * *